United States Patent
Hsiao et al.

(10) Patent No.: US 12,414,412 B2
(45) Date of Patent: Sep. 9, 2025

(54) LIGHT-EMITTING CHIP TRANSFER SYSTEM AND LIGHT-EMITTING CHIP TRANSFER METHOD

(71) Applicant: CHONGQING KONKA PHOTOELECTRIC TECHNOLOGY RESEARCH INSTITUTE CO., LTD., Chongqing (CN)

(72) Inventors: Chun-Lung Hsiao, Chongqing (CN); Chaowei Yin, Chongqing (CN)

(73) Assignee: CHONGQING KONKA PHOTOELECTRIC TECHNOLOGY RESEARCH INSTITUTE CO., LTD, Chongqing (CN)

( * ) Notice: Subject to any disclaimer, the term of this patent is extended or adjusted under 35 U.S.C. 154(b) by 516 days.

(21) Appl. No.: 17/971,151

(22) Filed: Oct. 21, 2022

(65) Prior Publication Data

US 2023/0065563 A1  Mar. 2, 2023

Related U.S. Application Data

(63) Continuation of application No. PCT/CN2021/114233, filed on Aug. 24, 2021.

(51) Int. Cl.
*H10H 20/85* (2025.01)
*H10H 20/01* (2025.01)
*H10H 20/825* (2025.01)

(52) U.S. Cl.
CPC ...... *H10H 20/8506* (2025.01); *H10H 20/018* (2025.01); *H10H 20/825* (2025.01)

(58) Field of Classification Search
CPC . H10H 20/8506; H10H 20/825; H10H 20/018
See application file for complete search history.

(56) References Cited

U.S. PATENT DOCUMENTS

2019/0393069 A1  12/2019  Paranjpe et al.

FOREIGN PATENT DOCUMENTS

| CN | 105493298 A | 4/2016 |
|----|-------------|--------|
| CN | 105870265 A | 8/2016 |
| CN | 108054286 A | 5/2018 |
| CN | 211480078 U | 9/2020 |
| WO | 2020087813 A1 | 5/2020 |

OTHER PUBLICATIONS

Zhou et al., CN 105493298, Apr. 13, 2016 (Year: 2016).*

(Continued)

*Primary Examiner* — Mary Ellen Bowman
(74) *Attorney, Agent, or Firm* — HAUPTMAN HAM, LLP

(57) ABSTRACT

A light-emitting chip transfer system and a light-emitting chip transfer method are provided. The light-emitting chip transfer system includes a growth substrate (1) grown with light-emitting chip (2), where the light-emitting chip (2) is magnetic and is bonded to the growth substrate (1) through a laser dissociation layer; a laser device configured to irradiate a laser to the laser dissociation layer to dissociate the laser dissociation layer; and a magnetic field generating device capable of generating a magnetic field in a gap between the light-emitting chip (2) and a chip bonding area corresponding to the light-emitting chip.

20 Claims, 14 Drawing Sheets

(56) References Cited

OTHER PUBLICATIONS

Ding et al., CN 108258006, Jul. 6, 2018 (Year: 2018).*
Robin et al., CN 110832635, Feb. 21, 2020 (Year: 2020).*
Li et al., CN 112967985, Jun. 15, 2021 (Year: 2021).*
Li, WO 2020087813, May 7, 2020 (Year: 2020).*
Dong et al., WO 2021082516, May 6, 2021 (Year: 2021).*
The International Search Report issued in corresponding International Application No. PCT/CN2021/114233, mailed Apr. 25, 2022.

* cited by examiner

LIGHT-EMITTING CHIP TRANSFER SYSTEM AND LIGHT-EMITTING CHIP TRANSFER METHOD

CROSS-REFERENCE TO RELATED APPLICATION(S)

This application is a continuation of International Application No. PCT/CN2021/114233, filed Aug. 24, 2021, the entire disclosure of which is hereby incorporated by reference.

TECHNICAL FIELD

This application relates to the field of light-emitting chip transfer, and in particular to a light-emitting chip transfer system and a light-emitting chip transfer method.

BACKGROUND

Mass transfer is the core technology of micro light-emitting diode (LED). The direct transfer of micro LED chips from a growth substrate to a display backplane is recognized as the ultimate mass transfer technology. However, since the micro LED chip is generally bonded on the growth substrate through gallium nitride, when the micro LED chip is transferred from the growth substrate to the display backplane, it is necessary to dissociate the gallium nitride through laser irradiation, so that the micro LED chip is separated from the growth substrate and then falls onto the display backplane. However, the nitrogen gas generated when gallium nitride dissociates will cause the micro LED chip to be displaced or flipped during falling onto the display backplane, such that the micro LED chip fails to be accurately transferred to a corresponding chip bonding area on the display backplane.

Therefore, in the currently used mass transfer technology, the micro LED chips need to be transferred from the growth substrate to a temporary substrate, and then micro LED chips are selectively picked up from the temporary substrate and then transferred to the display backplane through the transfer substrate. This process requires manufacture of specific weakened structures on the temporary substrate and the transfer substrate, and the light-emitting chip needs to be transferred from the growth substrate to the temporary substrate and the transfer substrate in turn and then transferred from the transfer substrate to the display backplane, resulting in high cost and low efficiency in transfer.

Therefore, how to accurately and directly transfer the LED chips from the growth substrate to the display backplane to improve the transfer efficiency of the LED chips and reduce the transfer cost is a problem to be solved at present.

SUMMARY

The present application provides a light-emitting chip transfer system. The light-emitting chip transfer system includes a growth substrate, a laser device, and a magnetic field generating device.

The growth substrate aligns a light-emitting chip with a chip bonding area on a front surface of a circuit board, where the light-emitting chip is magnetic and is bonded to the growth substrate through a laser dissociation layer, and the light-emitting chip and the chip bonding area aligned with the light-emitting chip are separated by a gap.

The laser device is configured to irradiate a laser to the laser dissociation layer, where the laser dissociation layer is dissociated under laser irradiation, to separate the light-emitting chip from the growth substrate.

The magnetic field generating device is disposed at one side away from the front surface of the circuit board and configured to generate a magnetic field in the gap, where the magnetic field is configured to attract the light-emitting chip separated from the growth substrate to fall onto the chip bonding area aligned with the light-emitting chip.

The present application further provides a light-emitting chip transfer method. The light-emitting chip transfer method is applicable to the above light-emitting chip transfer system. The method includes the following.

The light-emitting chip on the growth substrate is aligned with the chip bonding area on the circuit board.

The laser dissociation layer is irradiated with the laser, such that the light-emitting chip to be transferred is separated from the growth substrate, and falls onto the chip bonding area aligned with the light-emitting chip under the attraction of the magnetic field.

DESCRIPTION OF REFERENCE NUMBERS

Figure 1:
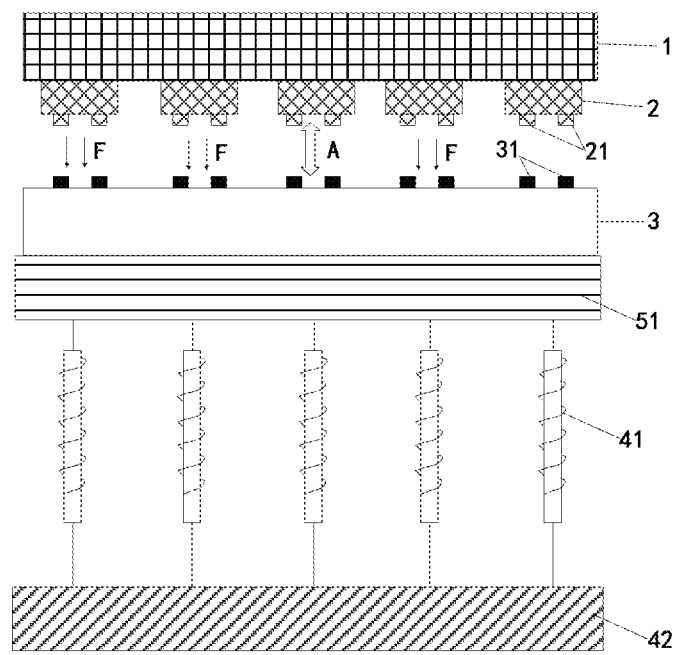
FIG. 1 is schematic structural diagram 1 of a light-emitting chip transfer system provided in embodiments of the present application.

1—growth substrate, 11—first growth substrate, 12—second growth substrate, 13—third growth substrate, 2—light-emitting chip, 21—electrode, 22—first light-emitting chip, 23—second light-emitting chip, 24—third light-emitting chip, 3—circuit board, 31—pad, 41—induction coil, 42—power supply device, 43—switch, 44—diamagnetic cover, 45—electromagnetic coil, 46—permanent magnet unit, 47—permanent magnet, 51—heating platform, 52—heat generating unit, 6—pressing plate (also called pressing sheet).

DETAILED DESCRIPTION

To facilitate understanding of the present application, the present application will be described more comprehensively below with reference to the related accompanying drawings. The preferred implementations of the present application are shown in the accompanying drawings. However, the present application may be implemented in many different forms and is not limited to the implementations described herein. Rather, these implementations are provided so that a thorough and complete understanding of the disclosure of the present application is provided.

Unless otherwise defined, all technical and scientific terms used herein have the same meaning as commonly understood by one of ordinary skill in the technical field to which the present application belongs. The terms used herein in the specification of the present application are merely for describing particular implementations, and are not intended to limit the present application.

In the micro light-emitting diode (LED) display technology, it is necessary to transfer micro LED chips to the display backplane through the mass transfer technology. When the micro LED chip is directly transferred from the growth substrate to the display backplane, the micro LED chip separated from the growth substrate is prone to be displaced or flipped when falling to the display backplane, such that the micro LED chip is inaccurately transferred to the aligned chip bonding area on the display backplane. Therefore, the current micro LED chip transfer can be achieved only with a temporary substrate (also called "transient substrate") and transfer substrate (also called "pick-up substrate"). For example, a micro LED display panel includes several subpixel renderings (SPRs), and each SPR includes a red-light micro LED chip, a blue-light micro LED chip, and a green-light micro LED chip. In the manufacturing of the display panel, it is necessary to transfer the red-light micro LED chip, the blue-light micro LED chip, and the green-light micro LED chip from their respective growth substrates to the display backplane. For example, the transfer process of the red-light micro LED chips is as follows.

A first adhesive layer (i.e., first weakened structure) is prepared on the temporary substrate, and then the first adhesive layer on the temporary substrate is attached to one surface of the growth substrate on which the red-light micro LED chip is grown. The red-light micro LED chip and the growth substrate are bonded through the gallium nitride layer.

The gallium nitride layer between the growth substrate and the red-light micro LED chip is irradiated with a laser, such that the red-light micro LED chip to be transferred is detached from the growth substrate, thereby transferring the red-light micro LED chip to the temporary substrate.

One surface of the transfer substrate on which a second adhesive layer (i.e., second weakened structure) is prepared is attached to one surface of the temporary substrate on which the red-light micro LED chip is carried, and the first adhesive layer on the temporary substrate is deboned. Thereby, the corresponding red-light micro LED chips are selectively picked up from the temporary substrate.

The red-light micro LED chip(s) picked up through the transfer substrate is transferred to the corresponding chip bonding area on the display backplane.

The blue-light micro LED chips and green-light micro LED chips are transferred to the display backplane in turn by adopting the above chip transfer process. As such, all micro LED chips are transferred to the display backplane.

In the above chip transfer process, two types of adhesive materials are needed to prepare the first adhesive layer and the second adhesive layer respectively, and it is necessary to ensure that the viscosity of the first adhesive layer is lower than that of the second adhesive layer. Thus, it is difficult to find suitable materials and the production cost is high. Furthermore, in the above transfer process, the micro LED chip needs to be transferred from the growth substrate to the temporary substrate and then from the temporary substrate to the transfer substrate, which is cumbersome and inefficient.

Based on this, the present application provides a solution that can solve the above technical problem, and the details of which will be described in the subsequent embodiments.

This embodiment provides a light-emitting chip transfer system. The light-emitting chip transfer system includes, but is not limited to, a growth substrate on which a light-emitting chip(s) is grown, a laser device, and a magnetic field generating device.

The light-emitting chip grown on the growth substrate is magnetic. During chip transfer, the light-emitting chip grown on the growth substrate can be aligned with the chip bonding area on the front surface of the circuit board.

It should be understood that, in this embodiment, the material, shape, and size of the growth substrate are not limited and can be flexibly selected according to requirements. For example, the growth substrate can be made of, but not limited to, sapphire, glass, or silicon, etc.

The laser dissociation layer in this embodiment is any bonding layer that can be dissociated under laser irradiation. For example, the laser dissociation layer can be, but not limited to, a gallium nitride layer. The gallium nitride layer can be dissociated into metal gallium and nitrogen gas under laser irradiation.

In this embodiment, when growing the light-emitting chip on the growth substrate, the laser dissociation layer can be formed on the growth substrate first, and the light-emitting chip can be grown on the laser dissociation layer. That is, the light-emitting chip and the growth substrate are bonded through the laser dissociation layer. In this embodiment, the process of growing the light-emitting chip on the growth substrate is not limited.

In this embodiment, the light-emitting chip grown on the growth substrate can be, but is not limited to, a flip chip, and electrodes on the light-emitting chip are located at one side away from the growth substrate. The light-emitting chip in this embodiment may be a miniature light-emitting chip, for example, may include but not limited to at least one of a mini LED chip and a micro LED chip.

In this embodiment, the number of light-emitting chips grown on the growth substrate and the specific layout of the light-emitting chips on the growth substrate can be flexibly set. At least a part of the light-emitting chips on the growth substrate and chip bonding areas on the circuit board are aligned. During chip transfer, the light-emitting chip to be transferred can be aligned with the chip bonding area on the front surface of the circuit board through the growth substrate, and the light-emitting chip and the chip bonding area aligned with the light-emitting chip are separated by a gap.

In this embodiment, the light-emitting chip can be flexibly set to be magnetic. For example, the electrodes of the light-emitting chip can be set to be magnetic, or a magnetic metal layer can be set in an epitaxial layer of the light-emitting chip. For example, in some application scenarios, to obtain a magnetic light-emitting chip, at least one material of gold (Au), silver (Ag), copper (Cu), iron (Fe), cobalt (Co), nickel (Ni), aluminum (Al), titanium (Ti), molybdenum (Mo), chromium (Cr), and zinc (Zn) can be used in the P-pad (i.e., P electrode) and N-pad (i.e., N electrode) of the light-emitting chip. Since these materials themselves have magnetism, the prepared light-emitting chip is magnetic. In other application scenarios, at least one metal layer including the above at least one metal can also be set in the epitaxial layer of the light-emitting chip.

The laser device in this embodiment can irradiate laser to the laser dissociation layer between the light-emitting chip and the growth substrate, so that the laser dissociation layer is dissociated under the laser irradiation, to separate the light-emitting chip from the growth substrate. It should be understood that, the laser device in this embodiment may be any device that can achieve the above purpose, which will not be repeated herein. The laser device in this embodiment can irradiate the laser dissociation layer with the laser through the growth substrate, or irradiate the laser dissociation layer with the laser through one side of the light-emitting chip. The laser device can only irradiate the laser to a part of the area of the laser dissociation layer (for example, only irradiate the laser to an area between the light-emitting chip to be transferred and the growth substrate of the laser dissociation layer) according to the requirements, or the laser device can also irradiate the laser to the whole laser dissociation layer according to requirements, which can be flexibly controlled according to application requirements and will not be repeated herein.

The magnetic field generating device in this embodiment is disposed at one side away from the front surface of the circuit board and is used to generate a magnetic field in the gap between the light-emitting chip and its aligned chip bonding area. The generated magnetic field acts on the magnetic light-emitting chip, and applies to the light-emitting chip a magnetic force F toward the circuit board. It is possible to avoid displacement or flipping of the light-emitting chip separated from the growth substrate while falling to its aligned chip bonding area.

When chip transfer is performed by adopting the chip transfer system provided in this embodiment, the magnetic light-emitting chip on the growth substrate is directly aligned with the chip bonding area on the front surface of the circuit board. Then, the laser device irradiates the laser dissociation layer between the light-emitting chip and the growth substrate, so that the light-emitting chip is separated from the growth substrate. The separated light-emitting chip is attracted by the magnetic field generated by the magnetic field generating device, and accurately falls to the aligned chip bonding area. Aa such, displacement or flipping of the light-emitting chip in the process of falling to the circuit board can be avoided. That is, using the light-emitting chip transfer system provided in this embodiment, the light-emitting chip on the growth substrate can be directly and accurately transferred from the growth substrate to the circuit board. There is no need to transfer the light-emitting chip from the growth substrate to the temporary substrate and then from the temporary substrate to the transfer substrate, and there is also no need to make weakened structures on the temporary substrate and the transfer substrate. As such, the transfer efficiency can be higher and the transfer cost can be lower.

In addition, it should be understood that, the circuit board in this embodiment may be a display backplane, or any circuit board for lighting, and may be a flexible circuit board or a rigid circuit board. In a case of a display backplane, the display backplane can be, but not limited to, a glass backplane or a printed circuit board (PCB). In this embodiment, the circuit board is provided with a chip bonding area(s), and pads corresponding to the electrodes of the light-emitting chip are disposed in the chip bonding area. It should be understood that, the number of chip bonding areas and the distribution thereof on the circuit board can be flexibly set according to application requirements. For example, the chip bonding areas can be distributed in an array on the circuit board, or can be flexibly distributed according to other rules, or even flexibly distributed according to requirements. In some application examples, to facilitate transfer of the light-emitting chip directly from the growth substrate to the circuit board, the distribution of the chip bonding areas on the circuit board can correspond to the layout and position of the corresponding light-emitting chips on the growth substrate.

It should be understood that, the chip bonding area in this embodiment is not limited to be bonded with the light-emitting chip. The light-emitting chip can also be replaced with other electronic chips according to application requirements, such as resistance chips, capacitor chips, driver chips, control chips, etc., which will not be repeated herein.

It should be understood that, the magnetic field generating device in this embodiment can be any device that can achieve the above purpose, and at least a part of the magnetic field generating device can be integrated in the circuit board, or can be disposed outside the circuit board. In addition, it should be understood that, in some application scenarios, the magnetic field generating device in this embodiment can also be replaced with other devices that can guide the light-emitting chip to accurately land on the aligned chip bonding area. For example, the magnetic field generating device can be replaced with a vacuum suction device that generates a vacuum suction force in the gap between the light-emitting chip and its aligned chip bonding area.

For ease of understanding, in this embodiment, the light-emitting chip transfer system provided in this embodiment is described below by taking several magnetic field generating devices as examples.

Figure 2:
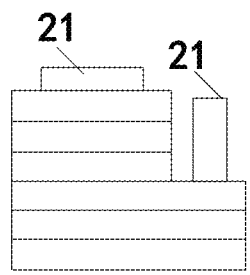
FIG. 2 is a schematic structural diagram of a light-emitting chip provided in embodiments of the present application.
Figure 3:
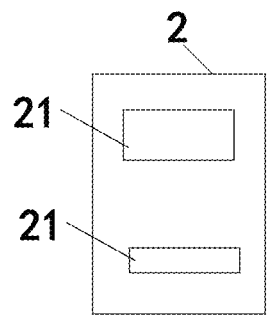
FIG. 3 is a top view of the light-emitting chip shown in FIG. 2.

An exemplary light-emitting chip transfer system is shown in FIG. 1. The light-emitting chip transfer system includes a growth substrate 1, and a light-emitting chip 2 grown on the growth substrate 1. The light-emitting chip 2 has electrodes 21, and the light-emitting chip 2 is magnetic and is bonded to the growth substrate 1 through a laser dissociation layer (not shown in the figure). In this example, the electrodes 21 may be set to be magnetic, and/or the epitaxial layer of the light-emitting chip 2 may include a magnetic metal layer. For example, referring to the light-emitting chip shown in FIG. 2 and FIG. 3, FIG. 2 is a cross-sectional view of the light-emitting chip 2, and FIG. 3 is a top view of the light-emitting chip 2. The electrodes 21 of the light-emitting chip 2 are magnetic.

In FIG. 1, the circuit board 3 is provided with multiple chip bonding areas. Only one chip bonding area can be set as required, and the chip bonding area is provided with pads 31 corresponding to the electrodes 21 of the light-emitting chip 2. After the light-emitting chip 2 on the growth substrate 1 and the chip bonding area on the circuit board 3 are aligned, there is a gap A between the light-emitting chip 2 and chip bonding area in alignment.

In this example, the magnetic field generating device includes multiple induction coils 41 in one-to-one correspondence with the chip bonding areas of the circuit board 3, and a power supply device 42 for supplying power to the induction coils 41. When the induction coil 41 is powered on, a magnetic field is generated in the gap between the light-emitting chip and the chip bonding area corresponding to the induction coil. That is, in this example, for each chip bonding area, one induction coil 41 is provided correspondingly. After each induction coil 41 is powered on, a magnetic field can be generated in its corresponding gap A. The magnetic field can apply a magnetic force F toward the circuit board (that is, toward the aligned chip bonding area) to the magnetic light-emitting chip 2, thereby guiding the light-emitting chip 2 to accurately fall to the aligned chip bonding area. It should be understood that, in this example, the power supply device 42 may be an intermediate device that connects the induction coils 41 with an external power source, or may be a power supply device that directly supplies power to the induction coils 41, which is not limited herein.

Figure 4:
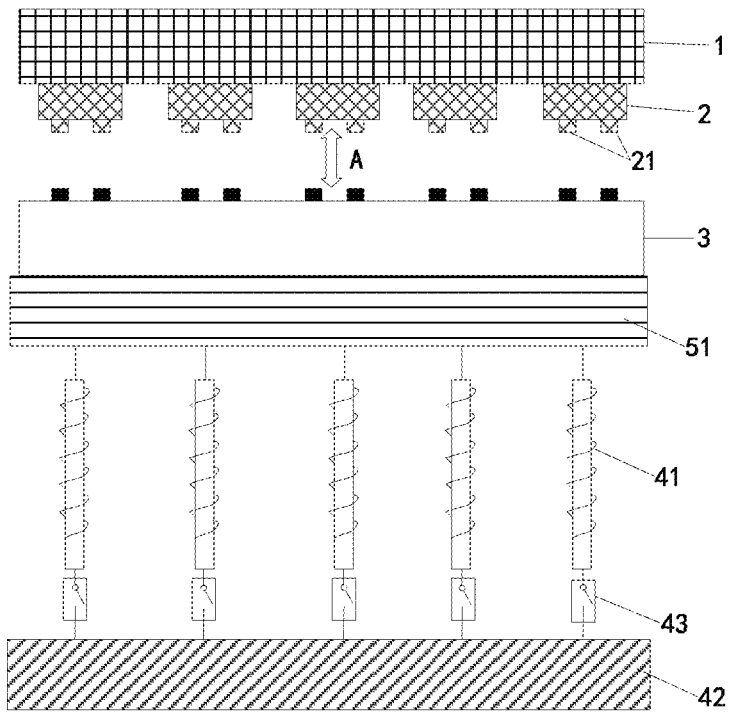
FIG. 4 is schematic structural diagram 2 of a light-emitting chip transfer system provided in embodiments of the present application.

Another exemplary light-emitting chip transfer system is shown in FIG. 4, compared with the light-emitting chip transfer system shown in FIG. 1, the main difference is that the magnetic field generating device also includes switches 43 arranged between each of the induction coils 41 and the power supply device 42 and configured to control conduction and disconnection between each of the induction coils 41 and the power supply device. In this way, each induction coil 41 can be controlled to be connected or disconnected with the power source according to the requirements, that is, it is possible to individually control a certain induction coil 41 to be powered on to generate a magnetic field or not to be powered on, achieving a more flexible and precise control method. For example, in the process of chip transfer, the induction coil 41 under the chip bonding area under the current light-emitting chip 2 to be transferred can be controlled to be powered on to generate a magnetic field, while the induction coils 41 under other chip bonding areas are not powered on.

Figure 5:
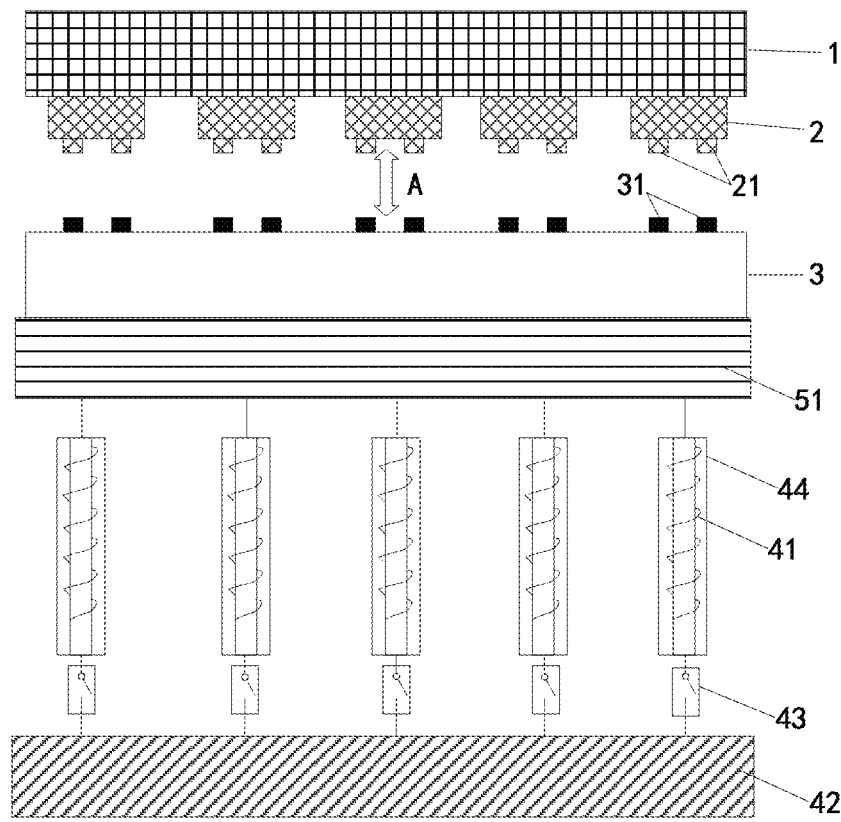
FIG. 5 is schematic structural diagram 3 of a light-emitting chip transfer system provided in embodiments of the present application.

Another exemplary light-emitting chip transfer system is shown in FIG. 5, compared with the light-emitting chip transfer system shown in FIG. 2, the main difference is that the magnetic field generating device further includes diamagnetic covers 44 which cover the induction coils 41 respectively. The arrangement of the diamagnetic covers 44 can avoid the mutual interference of the magnetic forces between the induction coils 41, which can further improve the accuracy of guiding the light-emitting chip 2.

In this embodiment, in the light-emitting chip transfer system shown in FIG. 1, FIG. 4, and FIG. 5, the induction coils 41 are disposed outside the circuit board 3 and the power supply device 42 is also disposed outside the circuit board 3.

Figure 6:
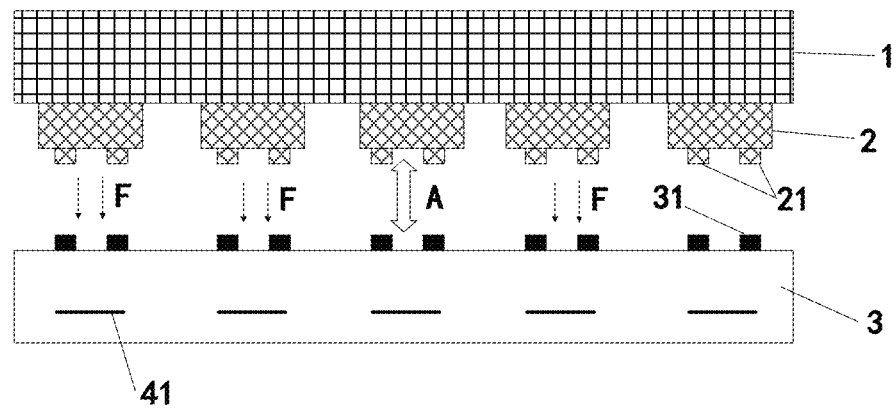
FIG. 6 is schematic structural diagram 4 of a light-emitting chip transfer system provided in embodiments of the present application.
Figure 7:
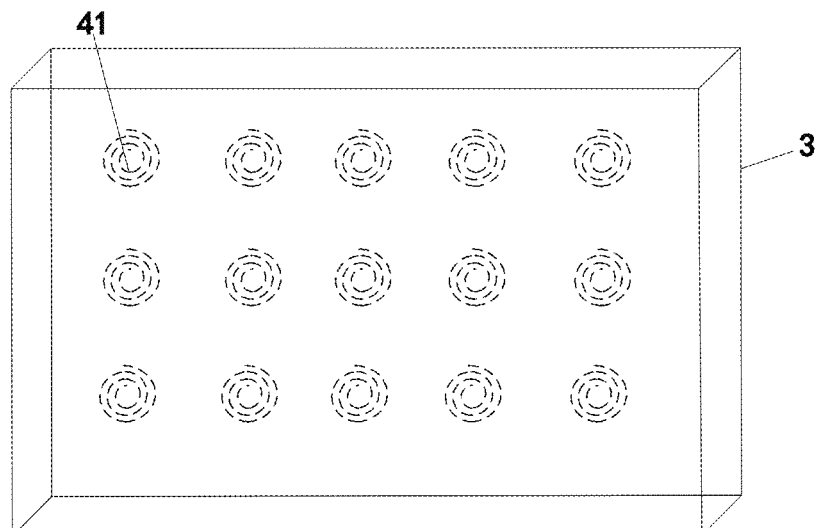
FIG. 7 is a schematic perspective view of the circuit board in FIG. 6.

In other examples of this embodiment, the induction coils 41 may also be disposed in the circuit board 3. For example, refer to FIG. 6 and FIG. 7, where FIG. 7 is a perspective view of the circuit board 3 in FIG. 6. For ease of understanding, the chip bonding area on the circuit board 3 is not shown in FIG. 7. Referring to FIG. 6 and FIG. 7, the induction coils 41 in this example are disposed in the circuit board 3 and are in one-to-one correspondence with the chip bonding areas on the circuit board 3. In this example, the power supply device 42 can also be integrated in the circuit board 3 or on the back of the circuit board 3, and can also be provided outside the circuit board 3.

Figure 10:
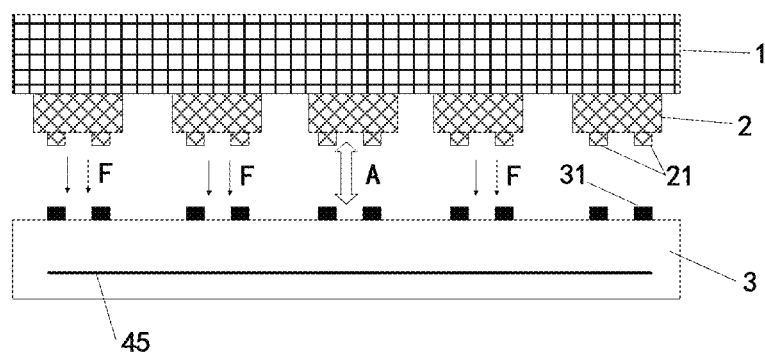
FIG. 10 is schematic structural diagram 6 of a light-emitting chip transfer system provided in embodiments of the present application.
Figure 11:
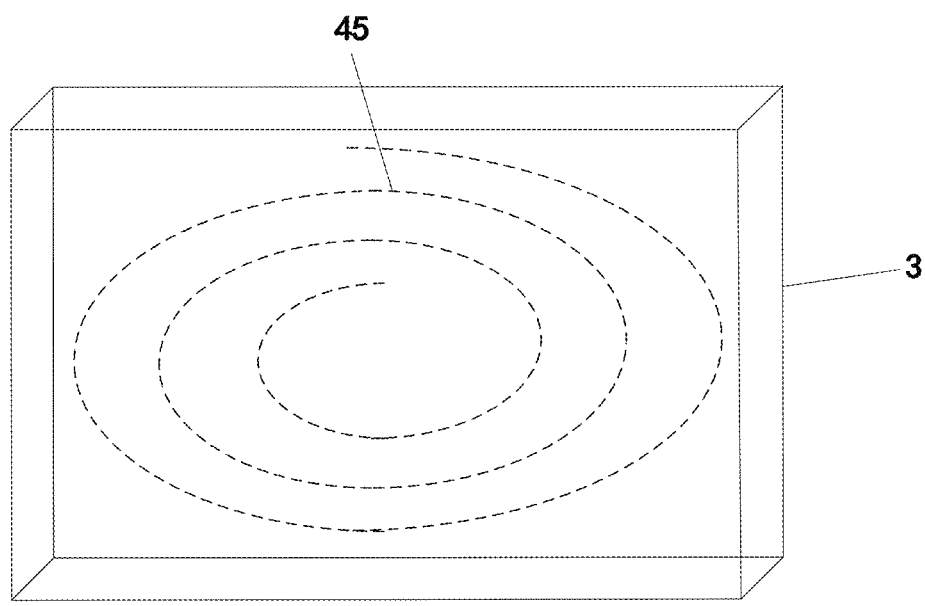
FIG. 11 is a schematic perspective view of the circuit board in FIG. 10.

The magnetic field generating devices shown in the above examples all include the induction coils 41 in one-to-one correspondence with the chip bonding areas. However, it should be understood that, in some examples, one induction coil can also be set to correspond to at least two chip bonding areas, and one chip bonding area can also be set to correspond to at least two induction coils, as long as the above guiding purpose can be achieved. For example, as an example shown in FIG. 10 and FIG. 11, the magnetic field generating device includes one electromagnetic coil 45 corresponding to chip bonding areas on the circuit board. When the electromagnetic coil 45 is powered on, a magnetic field is generated in the gap A between each chip bonding area of the circuit board 3 and the light-emitting chip 2 on the growth substrate 1. In the magnetic field generating device shown in FIG. 10 and FIG. 11, the electromagnetic coil 45 is disposed in the circuit board 3. However, it should be understood that, referring to the example shown in FIG. 1, the electromagnetic coil 45 can also be disposed outside the circuit board 3, and details are not described herein again.

In some examples of this embodiment, the light-emitting chip transfer system may further include a heating platform for carrying the circuit board. The heating platform is used to heat a solder or conductive glue on the pads in the chip bonding area to melt the solder or conductive glue, to bond the electrodes of the light-emitting chip falling in the chip bonding area with the pads. That is, in this example, in the chip transfer process, the circuit board can be set on the heating platform, and after the light-emitting chip is transferred from the growth substrate to the corresponding chip bonding area on the circuit board, the solder or conductive glue on the pads in the chip bonding area can be heated and melted through the heating platform, so that the electrodes of the light-emitting chip falling in the chip bonding area can be bonded to the pads. For example, an application example is shown in FIG. 1, FIG. 4, and FIG. 5, one heating platform 51 can be arranged between the induction coils 41 and the circuit board 3, and the heating platform 51 can generate heat to heat the pads on the circuit board 3 after being powered on. The heating platform 51 can be connected to an external power source through, but not limited to, the power supply device 42. The heating platform 51 is not limited to generating heat through being powered on. For another example, in other application examples, the heating platform 51 may also be provided under the circuit board 3 shown in FIG. 6 and FIG. 10. It should be understood that, the heating platform 51 in this embodiment is not limited to be disposed outside the circuit board 3, but can also be disposed in the circuit board 3. When disposed in the circuit board 3, the heating platform 51 no longer plays the role of carrying the circuit board 3.

Figure 8:
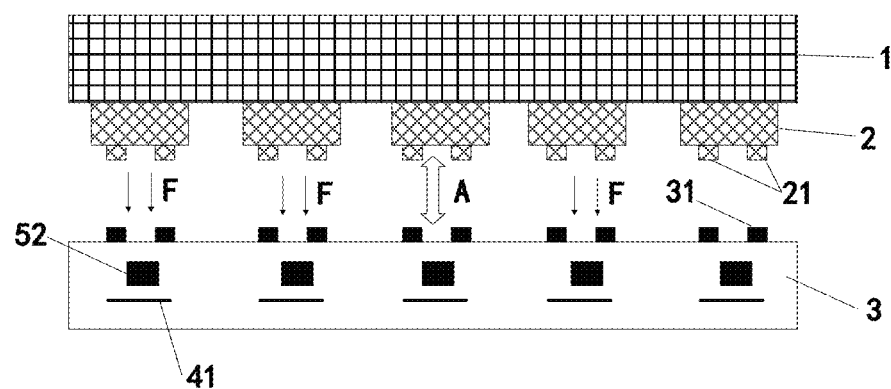
FIG. 8 is schematic structural diagram 5 of a light-emitting chip transfer system provided in embodiments of the present application.
Figure 9:
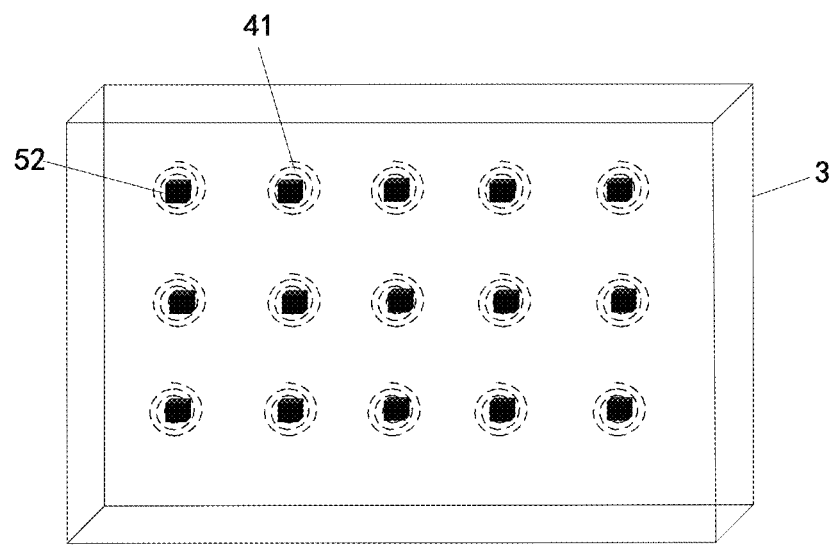
FIG. 9 is a schematic perspective view of the circuit board in FIG. 8.
Figure 12:
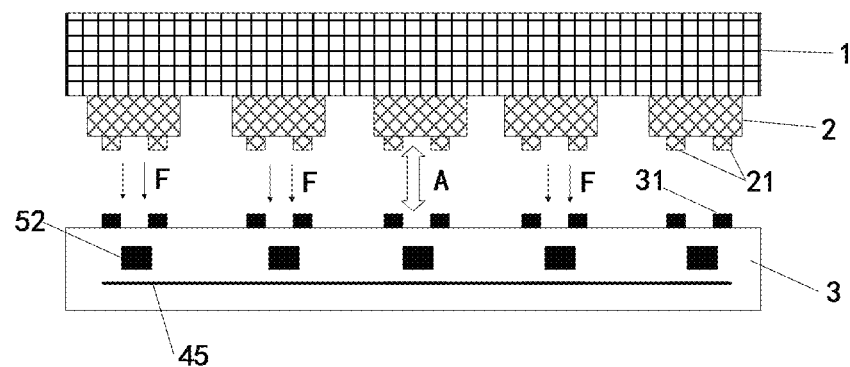
FIG. 12 is schematic structural diagram 7 of a light-emitting chip transfer system provided in embodiments of the present application.
Figure 13:
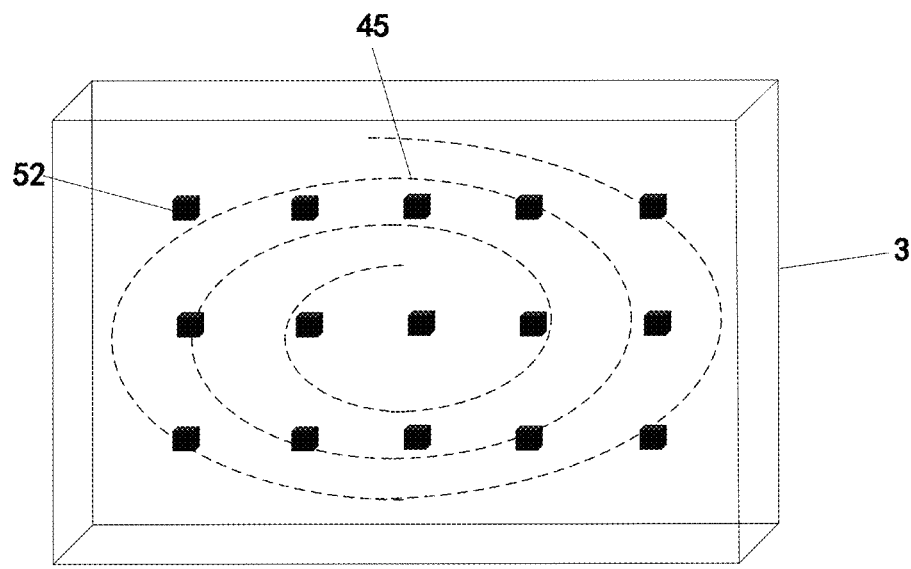
FIG. 13 is a schematic perspective view of the circuit board in FIG. 12.

For example, in some application examples, the light-emitting chip transfer system may further include multiple heat generating units respectively disposed between the induction coils and the chip bonding areas. Each heat generating unit generates heat after being powered on to heat the solder or conductive glue on the pads in the chip bonding area to melt the solder or conductive glue, to bond the electrodes of the light-emitting chip falling in the chip bonding area with the pads. In this application example, the heat generating units can be connected to an external power source through but not limited to the power supply device 42. An example of a setup for the heat generating units is shown in FIG. 8 and FIG. 9. Each heat generating unit 52 can use, but is not limited to, any resistance unit with large resistance value that can generate heat very quickly after being powered on. Furthermore, a switch can also be set between each heat generating unit 52 and an external power source according to requirements, to control the heat generating units 52 individually. Another example of a setup of the heat generating units is shown in FIG. 12 and FIG. 13, which is similar to the setting shown in FIG. 8 and FIG. 9, and will not be repeated herein. It should be understood that, the heat generating units 52 in the above example can also be integrated in the circuit board 3 shown in FIG. 1, FIG. 4, and FIG. 5, and in this case, the heating platform 51 shown in FIG. 1, FIG. 4, and FIG. 5 is omitted. It should be understood that, the heat generating units 52 in this embodiment can also be replaced by a whole heat generating layer covering the induction coils 41 or covering the electromagnetic coil 45.

It should be understood that, in this embodiment, it is not limited to use the induction coils 41 and the electromagnetic coil 45 in the above examples to generate the magnetic field. The induction coil 41 can also be replaced by a permanent magnet unit, or the electromagnetic coil 45 can be replaced by a permanent magnet. That is, in some examples of this embodiment, the magnetic field generating device may include permanent magnet units in one-to-one correspondence with the chip bonding areas, or include one permanent magnet corresponding to the chip bonding areas.

Figure 14A:
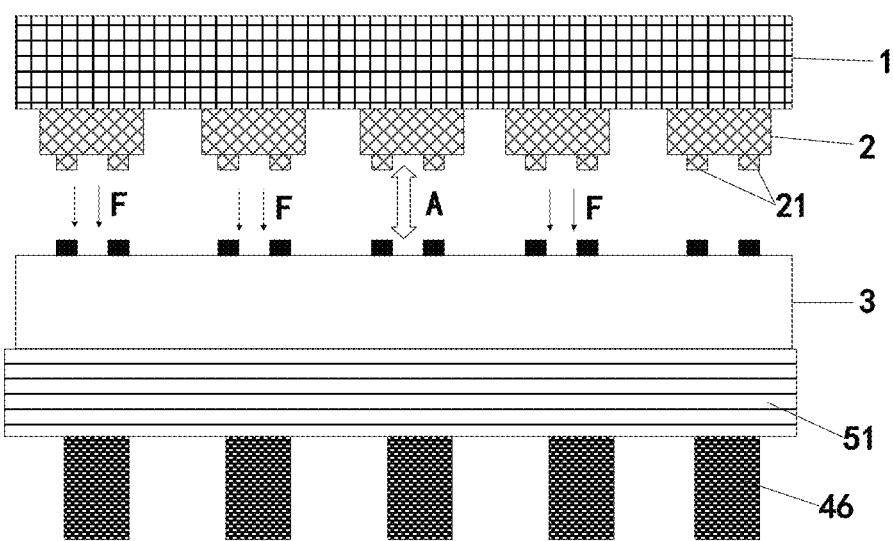
FIG. 14A is schematic structural diagram 8 of a light-emitting chip transfer system provided in embodiments of the present application.

For example, an example of a setup for permanent magnet units is shown in FIG. 14A. The magnetic field generating device includes permanent magnet units 46 that in one-to-one correspondence with the chip bonding areas on the circuit board. In this case, no power supply device 42 is required.

Figure 14B:
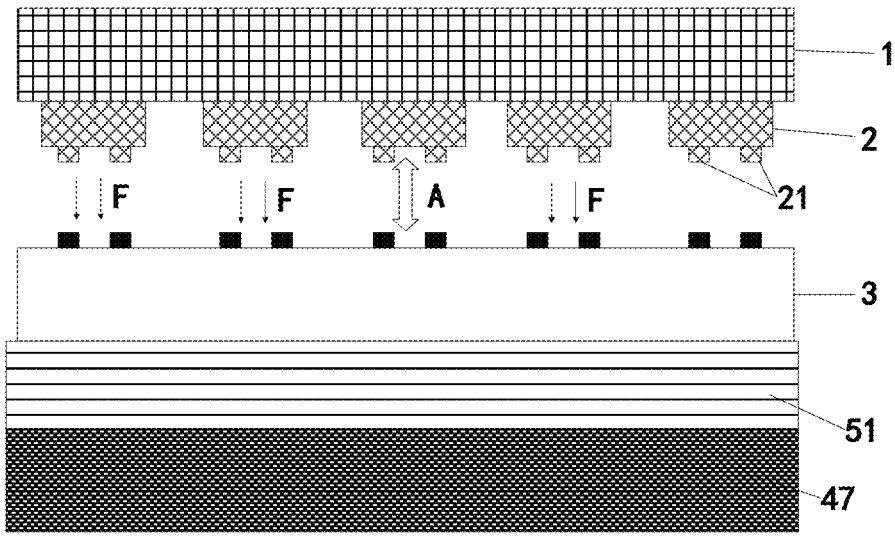
FIG. 14B is schematic structural diagram 9 of a light-emitting chip transfer system provided in embodiments of the present application.

An example of a setup for a permanent magnet is shown in FIG. 14B. The magnetic field generating device includes one permanent magnet 47 corresponding to chip bonding areas. The permanent magnet 47 can generate a magnetic field in the gap A between each chip bonding area and the light-emitting chip 2. In this case, no power supply device 42 is required.

In some examples of this embodiment, if the light-emitting chip falling onto the circuit board chip bonding area is tilted, when the electrodes of the tilted light-emitting chip are bonded to the pads in the chip bonding area, the bonding quality will be affected, reducing reliability. Even if the bonding is successful, the light-emitting direction of the tilted light-emitting chip will be different from that of other light-emitting chips. To avoid the above problem, the light-emitting chip transfer system in this example may further include a pressing sheet, which may be made of a soft material or a hard material, such as but not limited to PDMS (Polydimethylsiloxane) plate or glass plate, etc. The pressing sheet in this example is used to press the light-emitting chip that falls onto the chip bonding area to the aligned chip bonding area, so that the light-emitting chip is flat in the chip bonding area, avoiding tilt of the light-emitting chip. It should be understood that, in this example, in the process of heating the solder or conductive glue on the pads, the pressing sheet can be used to press the light-emitting chip in the chip bonding area simultaneously, to further improve the bonding quality. Alternatively, before heating of the solder or conductive glue on the pads, the pressing sheet can be used to press the light-emitting chip in the chip bonding area to make the light-emitting chip flat.

It can be seen that, in the chip transfer system provided in this embodiment, the magnetic light-emitting chip on the growth substrate can be directly aligned with the chip bonding area on the front surface of the circuit board. Then, the laser dissociation layer between the light-emitting chip and the growth substrate is irradiated with the laser device, so that the light-emitting chip is separated from the growth substrate. The light-emitting chip that falls off is attracted by the magnetic field generated by the magnetic field generating device, and accurately falls to the aligned chip bonding area, avoiding displacement or flipping of the light-emitting chip while falling to the circuit board. According to the requirements, the pressing sheet can be used to press the light-emitting chip falling on the chip bonding area to the aligned chip bonding area. It is possible to make the light-emitting chip in the chip bonding area flat, flatly bond each light-emitting chip on the circuit board, and improve consistency of light-emitting of the light-emitting chips. Further, in the whole chip transfer process, the temporary substrate and the transfer substrate are not needed, making the transfer process simpler, faster, more efficient, and lower in cost.

Another Optional Embodiment

Figure 15:
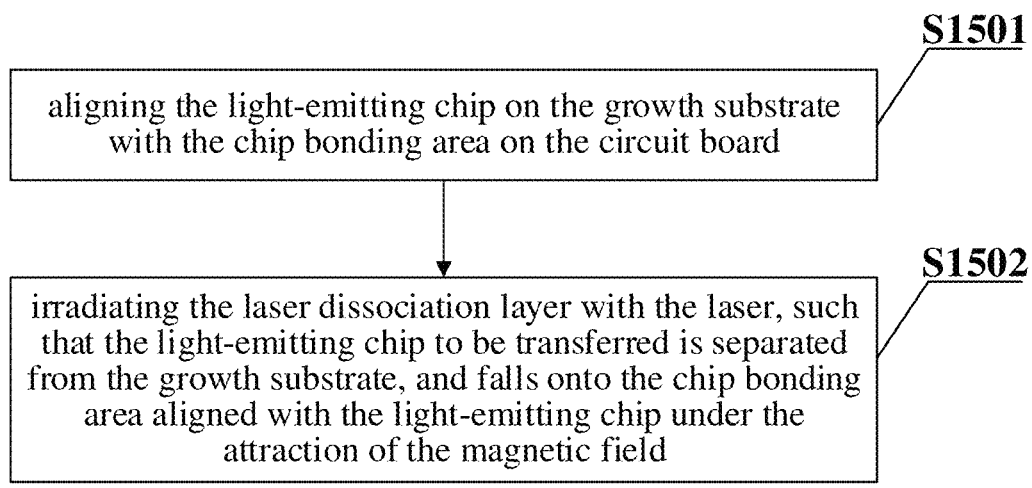
FIG. 15 is a schematic flowchart of a light-emitting chip transfer method provided in another embodiment of the present application.

For ease of understanding, this embodiment is described below by taking the light-emitting chip transfer method performed through the light-emitting chip transfer system shown in the above embodiment as an example. Referring to FIG. 15, the light-emitting chip transfer method includes but is not limited to the following.

S1501, the light-emitting chip on the growth substrate is aligned with the chip bonding area on the circuit board.

In this embodiment, after the light-emitting chip on the growth substrate and the chip bonding area on the circuit board are aligned, there is a gap between the aligned light-emitting chip and chip bonding area on the circuit board. The height of the gap can be flexibly set according to the requirements. For example, in some application scenarios, when the light-emitting chips needs to be transferred from the growth substrate to the circuit board in batches, the height of the gap can be greater than or equal to the height of the light-emitting chip. Therefore, the light-emitting chip previously transferred to the circuit board will not interfere with the subsequent transfer of other light-emitting chips. When the light-emitting chip needs to be transferred from the growth substrate to the circuit board only once, the height of the gap can be greater than or equal to the height of the light-emitting chip, or less than the height of the light-emitting chip.

S1502, a laser is irradiated to the laser dissociation layer, so that the light-emitting chip to be transferred is separated from the growth substrate and falls to the aligned chip bonding area under the attraction of the magnetic field.

In this embodiment, the laser can be irradiated to the laser dissociation layer through the laser device. In addition, when the laser is irradiated, the region of the laser dissociation layer can be selectively irradiated, or the whole laser dissociation layer can be directly irradiated. For example, in an application scenario, when all the light-emitting chips on the growth substrate need to be transferred to the circuit board, the laser device can be used to irradiate the whole laser dissociation layer with the laser, such that all the light-emitting chips on the growth substrate are removed from the growth substrate. When only a part of the light-emitting chips on the growth substrate needs to be transferred to the circuit board, an area between the light-emitting chip to be transferred and the circuit board of the laser dissociation layer needs to be irradiated with the laser, to make the light-emitting chip to be transferred separate from the growth substrate and other light-emitting chips remain on the growth substrate. That is, in this embodiment, a part or all of the light-emitting chips can be selectively transferred from the growth substrate to the circuit board, which can be flexibly adopted according to application requirements.

In this embodiment, the light-emitting chip transfer method further includes: heating the solder or conductive glue on the pads in the chip bonding area to melt the solder or conductive glue, to bond the electrodes of the light-emitting chip falling in the chip bonding area with the pads. The manner of heating the solder or conductive glue on the pads in the chip bonding area can be, but is not limited to, the manner shown in the foregoing embodiment, and details are not repeated herein. It should be understood that, in this embodiment, after all the light-emitting chips to be transferred are transferred to the circuit board, the pads in each chip bonding area on the circuit board are heated, to achieve bonding between the electrodes of each light-emitting chip and the corresponding pads. This does not require heating the circuit board for multiple times, which can improve the consistency and reliability of chip bonding. In some application scenarios, after the light-emitting chip is transferred from the growth substrate to the circuit board and before the next transfer of the light-emitting chip, the pads corresponding to the light-emitting chip currently transferred to the circuit board are selectively heated or all the pads are heated, so that the light-emitting chips currently transferred to the circuit board are bonded, and then proceed to the next transfer of the light-emitting chip.

In this embodiment, before heating the solder or conductive glue on the pads in the chip bonding area to melt the solder or conductive glue, the method may further include: pressing the light-emitting chip falling on each chip bonding area to each light-emitting chip through the pressing sheet, which makes the light-emitting chip in each chip bonding area flat, avoids the light-emitting chip from being tilted in the bonding process, and further improves the consistency and reliability of bonding.

In the field of micro LED display, the number of micro LED chips transferred to the display backplane is basically above tens of thousands. Therefore, after the completion of the micro LED chip transfer, it is difficult to detect dead pixels on the display backplane, and even if the dead pixels are detected, it is difficult to repair them. Even if they are repaired, the repair process is complicated. In addition, in the existing micro LED chip transfer, the micro LED chips on the growth substrate are fully peeled off as a whole through the laser, and all the micro LED chips are transferred to the temporary substrate, resulting in the uncontrollable quality of the chips on the final prepared micro LED display device, which makes the subsequent maintenance cost relatively high. In addition, because the light-emitting wavelength of the micro LED chip cannot be preselected, the final prepared display device has poor light-emitting uniformity. To solve this problem, in this embodiment, before irradiating laser to the laser dissociation layer to separate the light-emitting chip to be transferred from the growth substrate, the method may further include the following.

Each light-emitting chip on the growth substrate is detected, and the unqualified light-emitting chip is removed from the growth substrate or marked. As such, the light-emitting chips left on the growth substrate are qualified light-emitting chips or the unqualified light-emitting chips on the growth substrate are marked, to try to avoid that dead pixels exists in the light-emitting chips transferred to the circuit board, to avoid subsequent detection and repair of the dead pixels, and improve product quality and reduce maintenance cost.

In this embodiment, the detection of each light-emitting chip on the growth substrate may include, but is not limited to, at least one of the following.

The appearance of each light-emitting chip is detected.

The optical property of each light-emitting chip is tested.

For example, in one example, through detection manners not limited to the micro photoluminescence/automated optical inspection (PL/AOI), for the optical property and appearance quality of the light-emitting chip on the growth substrate, the corresponding mapping data can be generated in advance, to determine the unqualified light-emitting chip and remove the unqualified light-emitting chip from the growth substrate.

In some examples of this embodiment, the detection of the optical property of each light-emitting chip may include, but is not limited to: detecting the main wavelength of each light-emitting chip, and determining the light-emitting chip whose main wavelength has a difference with the preset standard main wavelength greater than a preset difference to be an unqualified light-emitting chip. As a result, the main wavelengths of the light-emitting chips retained on the growth substrate have good consistency, thereby improving the light-emitting uniformity of the light-emitting component, and making the display effect or lighting effect better.

In an application scenario, when the light-emitting chips of one color are needed on the circuit board, the light-emitting chips of the corresponding color can be directly transferred from the growth substrate to the circuit board using the transfer method shown in FIG. 15 above. When the light-emitting chips of two or more colors need to be transferred to the circuit board, the light-emitting chips of each color need to be transferred to the circuit board using the transfer method shown in FIG. 15 above. For ease of understanding, in this embodiment, the chip transfer process in the above two cases is described by way of example below.

In an example, it is assumed that the light-emitting chip grown on the growth substrate is a blue light-emitting chip, the circuit board is a display backplane, and only the blue light-emitting chip is transferred to the circuit board. Then, the corresponding light conversion layer is set on the corresponding blue light-emitting chip for light color conversion. In this example, the chip transfer system shown in FIG. 5 is used (the chip transfer system shown in other figures can also be used, the transfer process is similar, which will not be repeated herein). An example process of transferring light-emitting chips to the circuit board is shown in FIG. 16A to FIG. 16E, including the following.

Figure 16A:
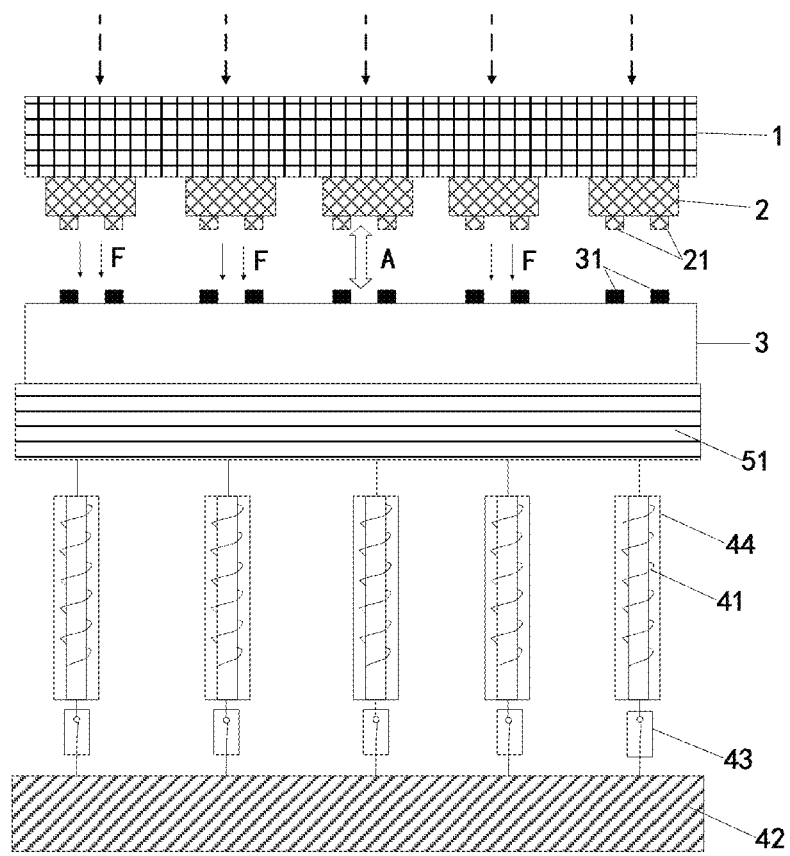
FIG. 16A is a schematic diagram of aligning a growth substrate and a circuit board provided in another embodiment of the present application.

S1601, referring to FIG. 16A, the circuit board 3 is set on the heating platform 51, the light-emitting chip 2 on the growth substrate 1 and the circuit board 3 are aligned, where there is a gap A between the aligned light-emitting chip 2 and circuit board 3. The height of the gap A in this example may be greater than or equal to the height of the light-emitting chip 2, and may also be smaller than the height of the light-emitting chip 2. The laser dissociation layer is irradiated with the laser from one surface of the growth substrate 1 where the light-emitting chip is not grown through the laser device. In this example, the whole laser dissociation layer is irradiated with the laser, so that all the light-emitting chips 2 on the growth substrate 1 are detached from the growth substrate 1.

Figure 16B:
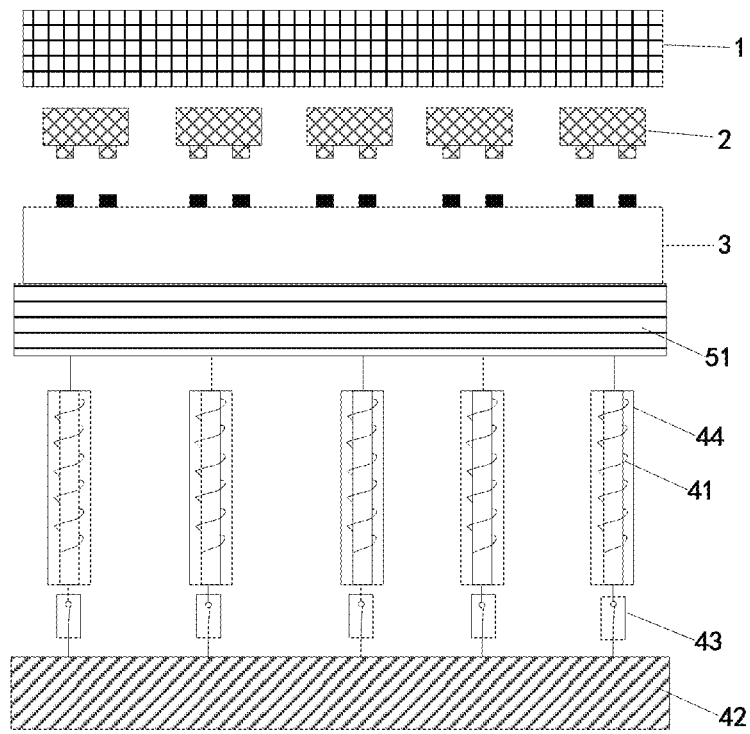
FIG. 16B is a schematic diagram of separating a light-emitting chip from the growth substrate provided in another embodiment of the present application.
Figure 16C:
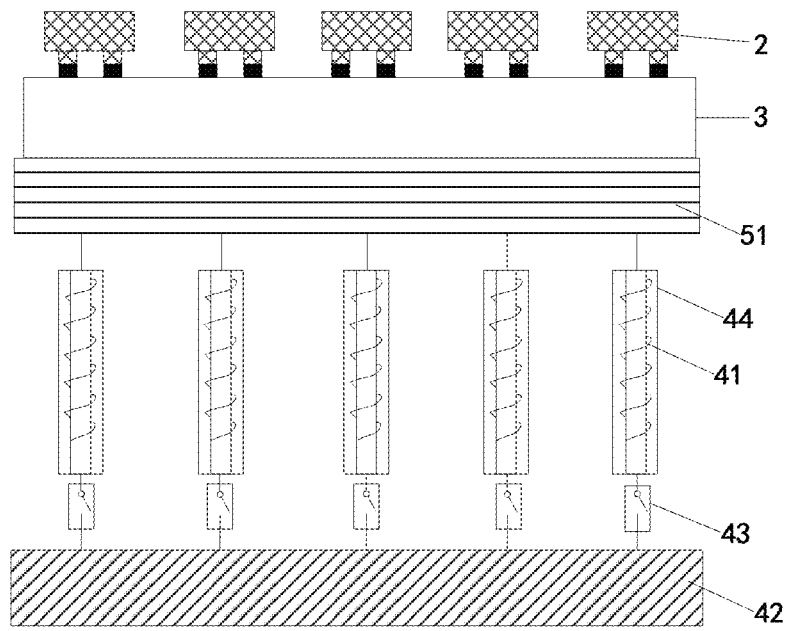
FIG. 16C is a schematic diagram of transferring the light-emitting chip to the circuit board provided in another embodiment of the present application.

S1602, referring to FIG. 16B and FIG. 16C, each light-emitting chip 2 detached from the growth substrate 1 accurately falls onto the corresponding chip bonding area under the guidance of the magnetic field generated after the corresponding induction coil 41 is powered on. It should be understood that, in this example, the induction coil 41 can be powered on to generate the magnetic field before or in synchronization with S1601. In this example, the corresponding induction coil 41 can be disconnected or remain connected with the power supply, after each light-emitting chip 2 accurately falls onto the corresponding chip bonding area under the guidance of the magnetic field generated once the corresponding induction coil 41 is powered on.

Figure 16D:
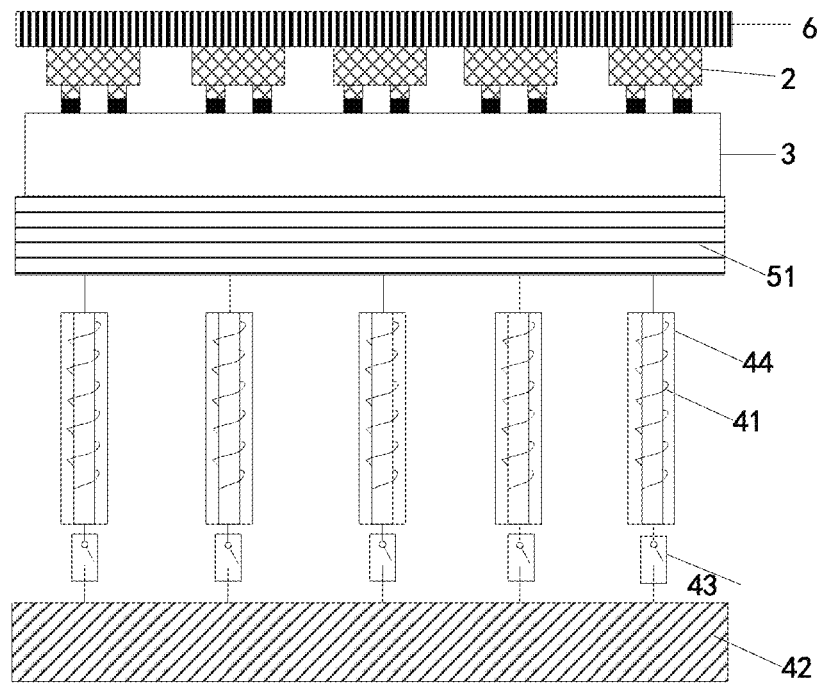
FIG. 16D is a schematic diagram of pressing the light-emitting chip with a pressing plate provided in another embodiment of the present application.

S1603, referring to FIG. 16D, the light-emitting chips 2 on the circuit board are pressed toward the circuit board 3 through a pressing plate 6 to ensure that the light-emitting chips are in a flat state as much as possible.

Figure 16E:
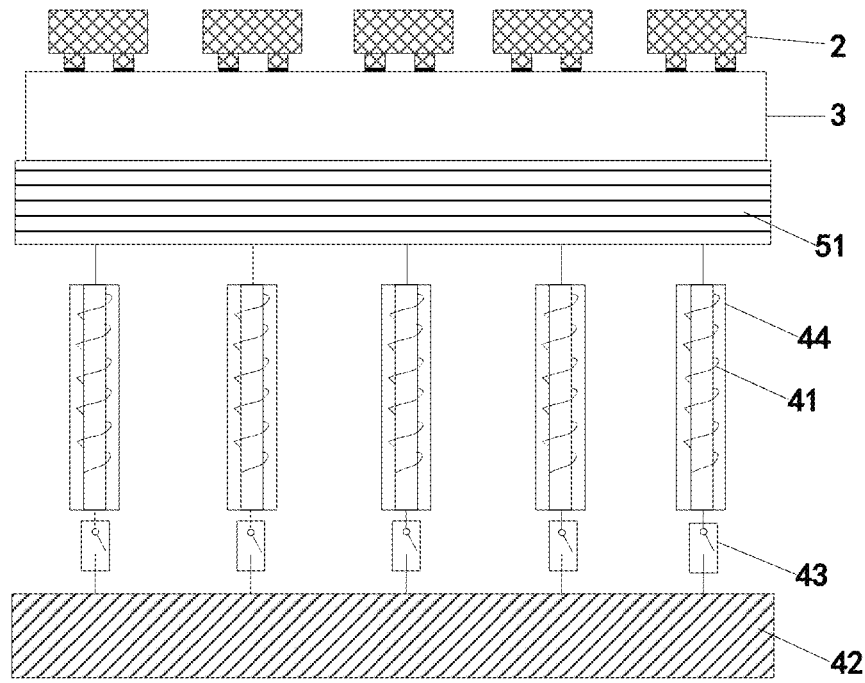
FIG. 16E is a schematic diagram of bonding the light-emitting chip to the circuit board provided in another embodiment of the present application.

S1604, referring to FIG. 16E, the solder or conductive glue on the pads 31 is heated through the heating platform 51 to melt the solder or conductive glue, so that the light-emitting chip 2 is bonded to the circuit board 3, and then circuit board 3 is removed from the heating platform.

In another example, it is assumed that the growth substrate includes a first growth substrate grown with a first light-emitting chip (e.g., a red light-emitting chip), a second growth substrate grown with a second light-emitting chip (e.g., a green light-emitting chip), and a third growth substrate grown with a third light-emitting chip (e.g., a blue light-emitting chip), and a light-emitting color of the first light-emitting chip, a light-emitting color of the second light-emitting chip, and a light-emitting color of the third light-emitting chip are different.

In this example, aligning the light-emitting chip on the growth substrate with the chip bonding area on the circuit board includes: aligning the light-emitting chip on one of the first growth substrate, the second growth substrate, and the third growth substrate with the chip bonding area on the circuit board and aligning the light-emitting chip on a current growth substrate with the chip bonding area on the circuit board after the light-emitting chip on the previous growth substrate falls to the chip bonding area aligned with the light-emitting chip, where a height of the gap between the light-emitting chip on the current growth substrate and the chip bonding area on the circuit board is greater than or equal to a height of the light-emitting chip that has fallen onto the chip bonding area. The process of transferring the first light-emitting chip, the second light-emitting chip, and the third light-emitting chip to the circuit board in turn is described below as an example, referring to FIG. 17A to FIG. 17K, including the following.

Figure 17A:
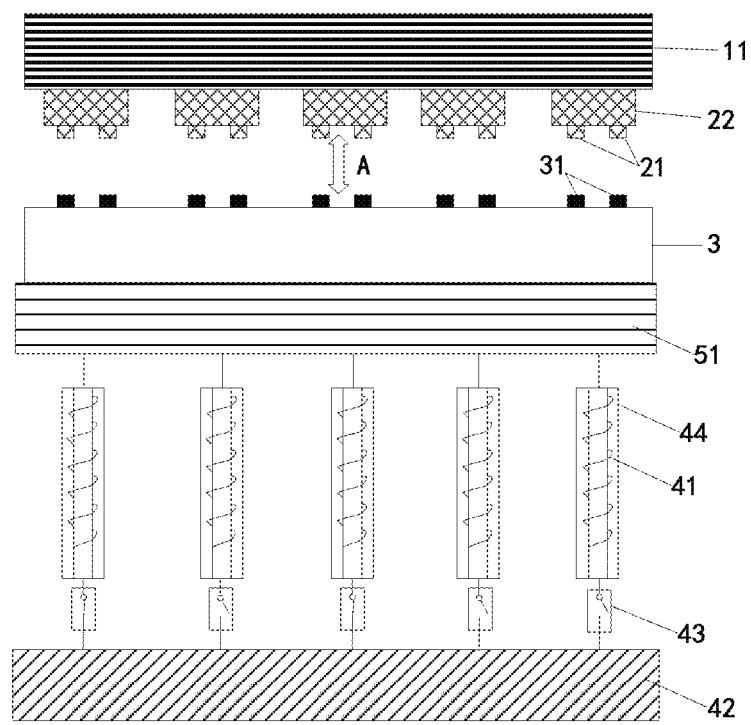
FIG. 17A is a schematic diagram of aligning a first growth substrate and a circuit board provided in another embodiment of the present application.

S1701, referring to FIG. 17A, the circuit board 3 is set on the heating platform 51, and the first light-emitting chip 22 on the first growth substrate 11 is set in alignment with the circuit board 3, there is a gap A between the aligned first light-emitting chip 22 and chip bonding area. In this step, the height of the gap A may be greater than or equal to the height of the first light-emitting chip 22, and may also be smaller than the height of the first light-emitting chip 22. The laser dissociation layer is irradiated with the laser from one surface of the first growth substrate 11 on which the light-emitting chip is not grown through the laser device. In this example, the region of the laser dissociation layer corresponding to the first light-emitting chip 22 to be transferred is irradiated with the laser, so that the first light-emitting chip 22 to be transferred on the first growth substrate 11 is separated from the first growth substrate 11.

Figure 17B:
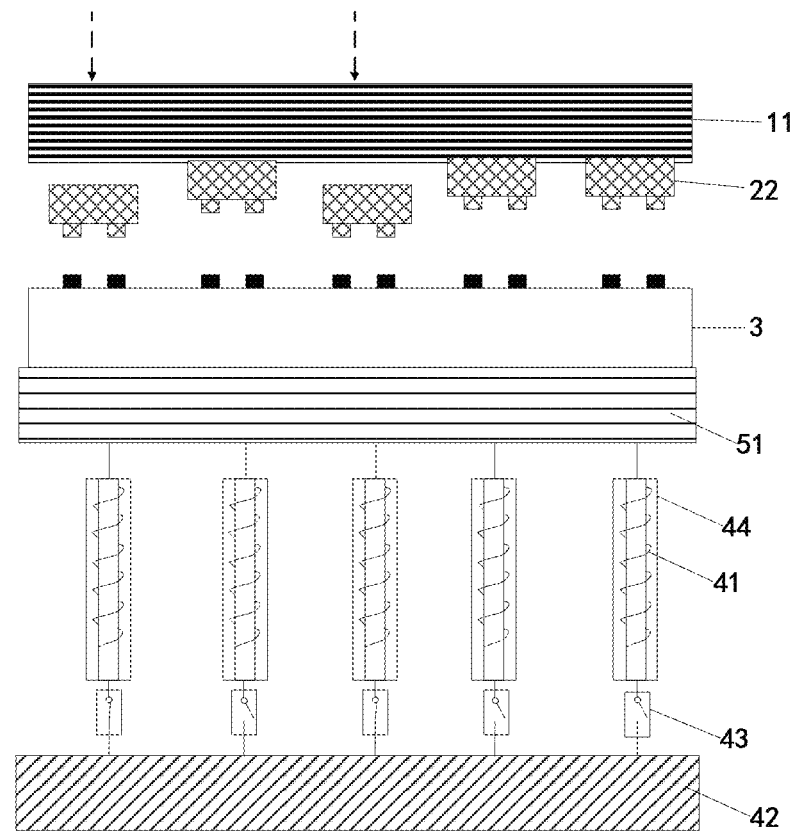
FIG. 17B is a schematic diagram of separating a first light-emitting chip from the first growth substrate provided in another embodiment of the present application.
Figure 17C:
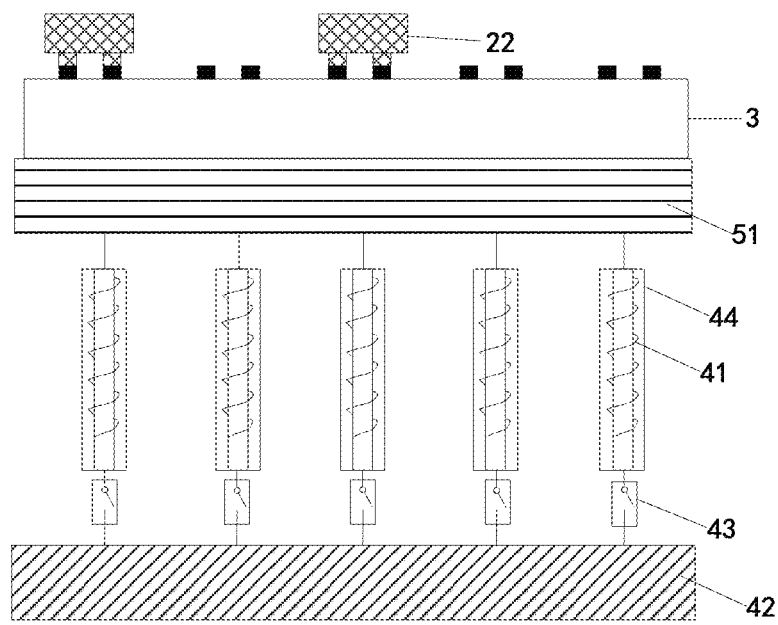
FIG. 17C is a schematic diagram of transferring the first light-emitting chip to the circuit board provided in another embodiment of the present application.

S1702, referring to FIG. 17B and FIG. 17C, each first light-emitting chip 22 detached from the first growth substrate 11 is guided by the magnetic field generated after the corresponding induction coil 41 is powered on and accurately falls to the corresponding chip bonding area. It should be understood that, in this example, the corresponding induction coil 41 can be powered on to generate a magnetic field before or in synchronization with S1701. In this example, after each first light-emitting chip 22 detached from the first growth substrate 11 is guided by the magnetic field generated after the corresponding induction coil 41 is powered on and accurately falls onto the corresponding chip bonding area, the corresponding induction coil 41 may be disconnected or remain connected with the power source.

Figure 17D:
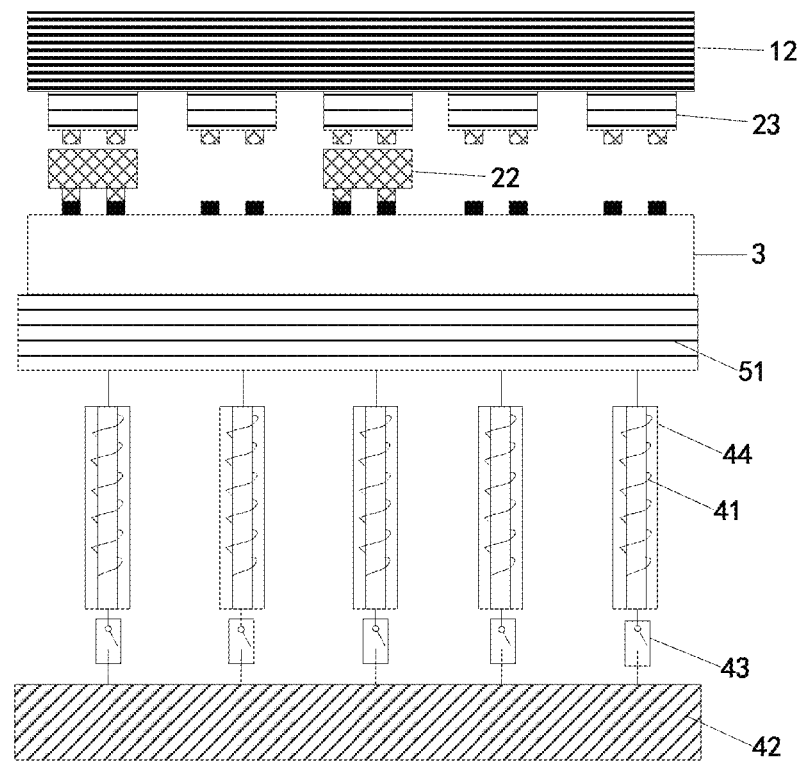
FIG. 17D is a schematic diagram of aligning a second growth substrate and the circuit board provided in another embodiment of the present application.

S1703, referring to FIG. 17D, the second light-emitting chip 23 on the second growth substrate 12 and the circuit board 3 are set in alignment, and the aligned second light-emitting chip 23 and chip bonding area are separated by gap A. In this step, the height of the gap A is greater than or equal to the height of the first light-emitting chip 22. The laser dissociation layer is irradiated with the laser from one surface of the second growth substrate 12 on which the light-emitting chip is not grown through the laser device. In this example, the laser is irradiated to the region of the laser dissociation layer corresponding to the second light-emitting chip 23 to be transferred, so that the second light-emitting chip 23 to be transferred on the second growth substrate 12 is separated from the second growth substrate 12.

Figure 17E:
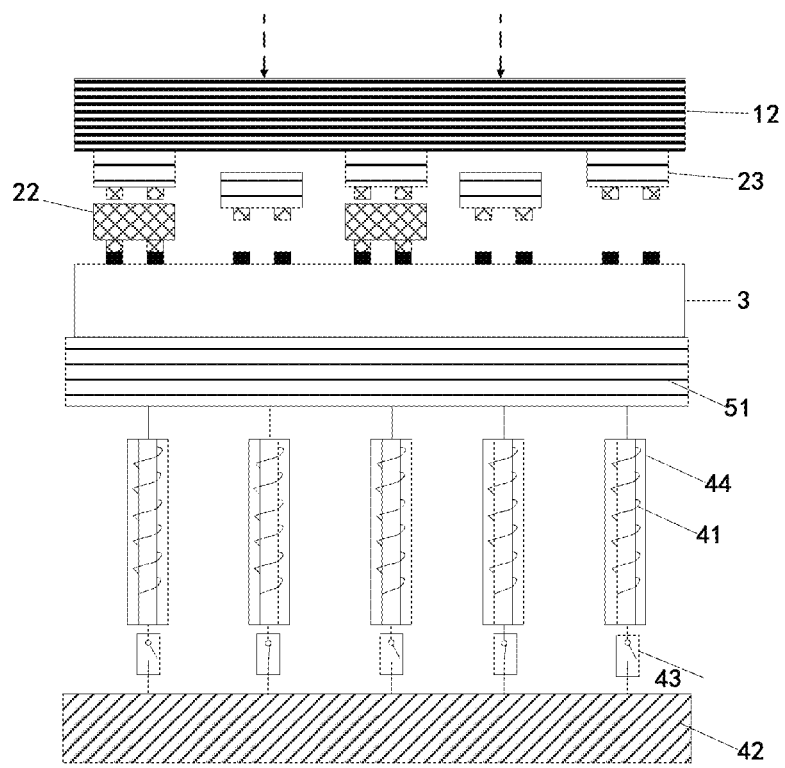
FIG. 17E is a schematic diagram of separating a second light-emitting chip from the second growth substrate provided in another embodiment of the present application.
Figure 17F:
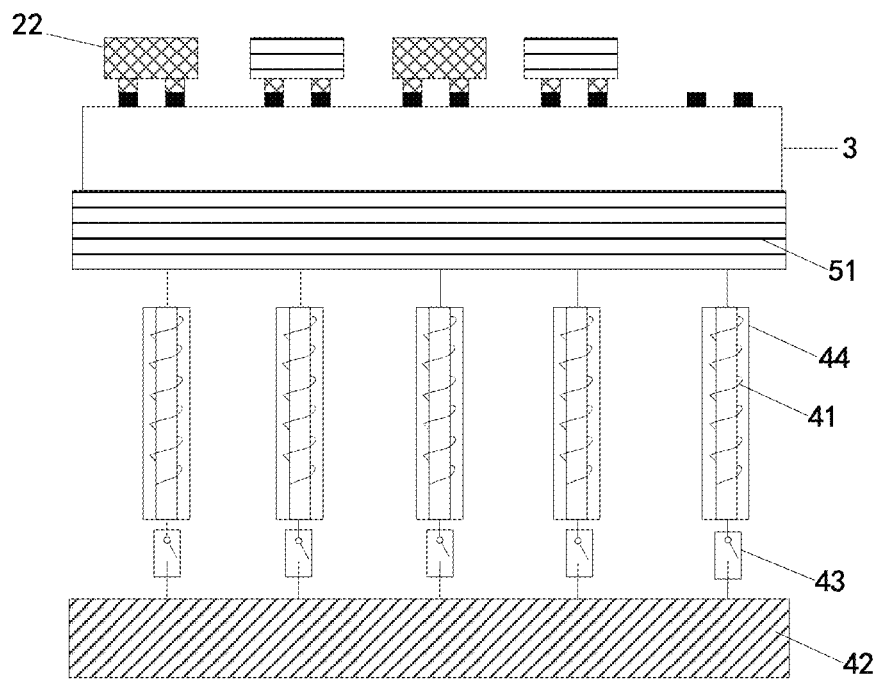
FIG. 17F is a schematic diagram of transferring the second light-emitting chip to the circuit board provided in another embodiment of the present application.

S1704, referring to FIG. 17E and FIG. 17F, each second light-emitting chip 23 separated from the second growth substrate 12 is guided by the magnetic field generated after the corresponding induction coil 41 is powered on, and accurately falls to the corresponding chip bonding area.

Figure 17G:
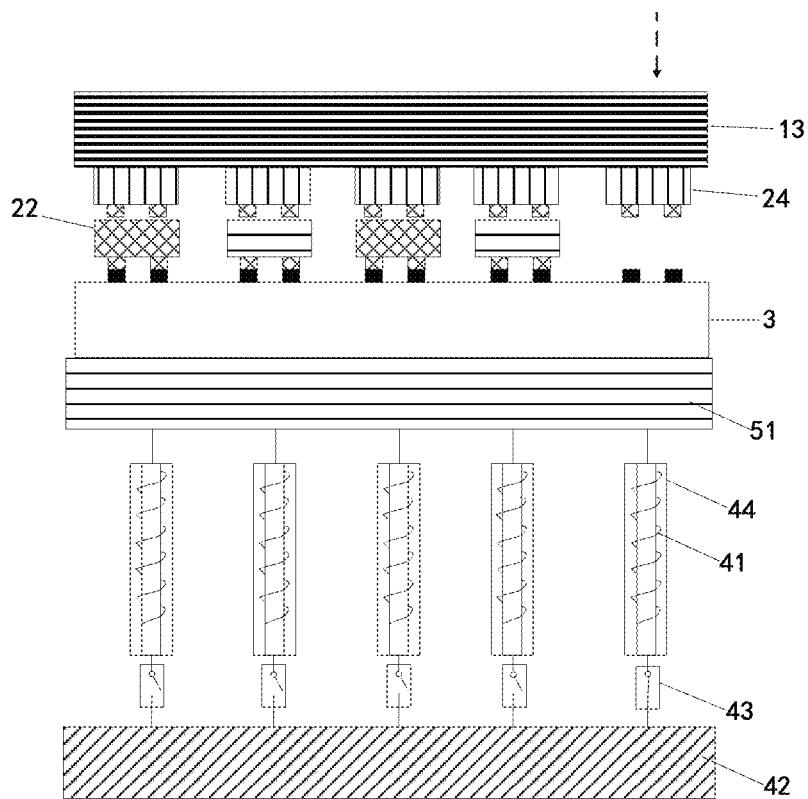
FIG. 17G is a schematic diagram of aligning a third growth substrate and the circuit board provided in another embodiment of the present application.

S1705, referring to FIG. 17G, the third light-emitting chip 24 on the third growth substrate 13 and the circuit board 3 are set in alignment, and the aligned third light-emitting chip 24 and chip bonding area are separated by a gap A. In this step, the height of the gap A is greater than or equal to the height of the first light-emitting chip 22 and/or the second light-emitting chip 23. The laser dissociation layer is irradiated with the laser from one surface of the third growth substrate 13 on which the light-emitting chip is not grown through the laser device. In this example, the region of the laser dissociation layer corresponding to the third light-emitting chip 24 to be transferred is irradiated with the laser, so that the third light-emitting chip 24 to be transferred on the third growth substrate 13 is separated from the third growth substrate 13.

Figure 17H:
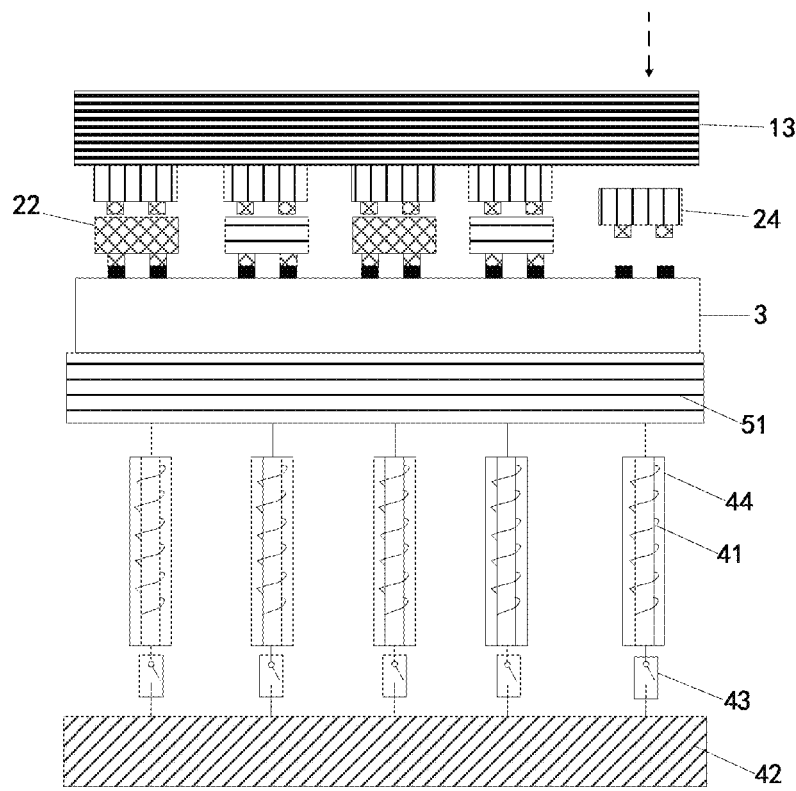
FIG. 17H is a schematic diagram of separating a third light-emitting chip from the third growth substrate provided in another embodiment of the present application.
Figure 17I:
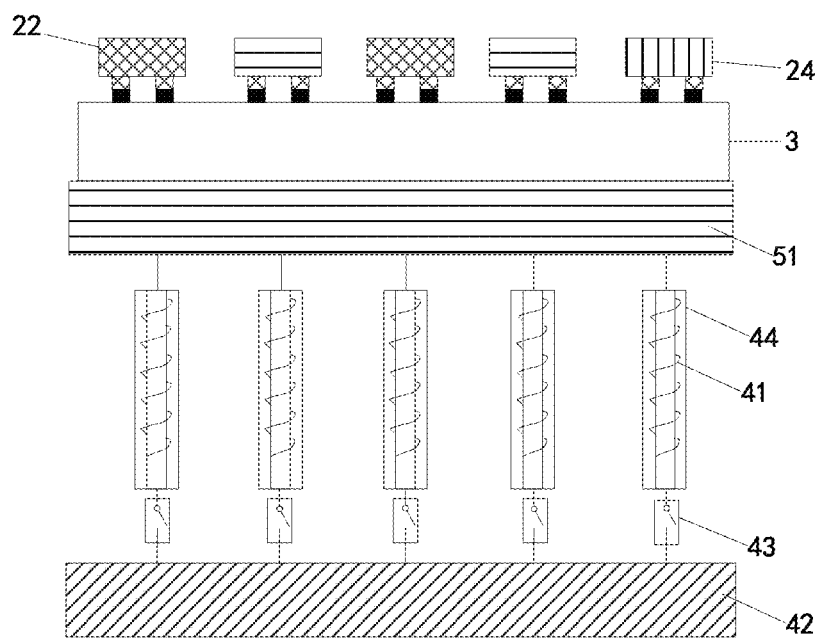
FIG. 17I is a schematic diagram of transferring the third light-emitting chip to the circuit board provided in another embodiment of the present application.

S1706, referring to FIG. 17H and FIG. 17I, each third light-emitting chip 24 separated from the third growth substrate 13 is guided by the magnetic field generated after the corresponding induction coil 41 is powered on, and accurately falls to its corresponding chip bonding area.

Figure 17J:
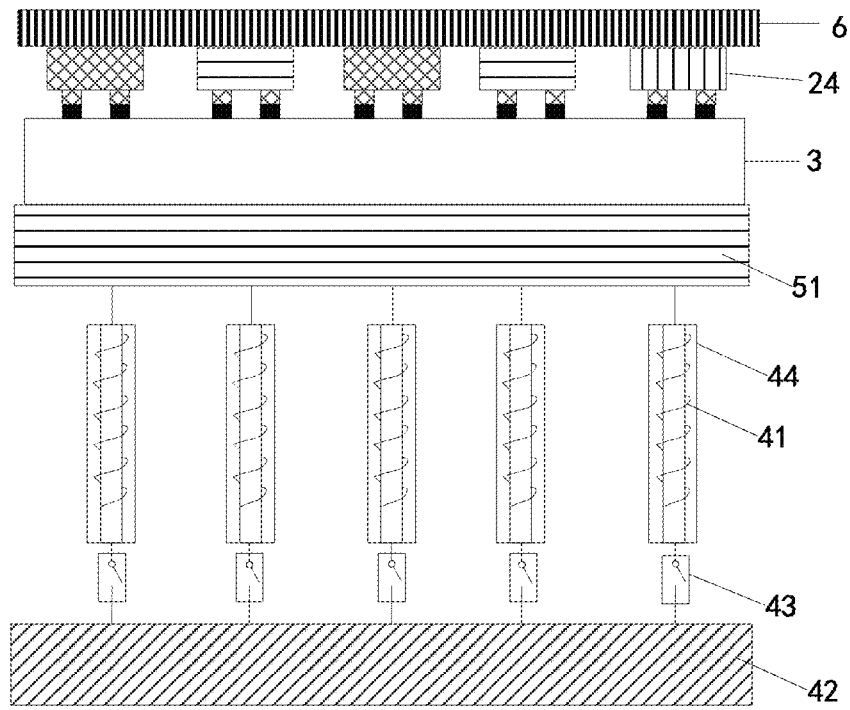
FIG. 17J is a schematic diagram of pressing the first light-emitting chip, the second light-emitting chip, and the third light-emitting chip with a pressing plate provided in another embodiment of the present application.

S1707, referring to FIG. 17J, each first light-emitting chip 22, each second light-emitting chip 23, and each third light-emitting chip 24 on the circuit board are pressed through the pressing plate 6 toward the circuit board 3, to ensure that each light-emitting chip is in a flat state as much as possible.

Figure 17K:
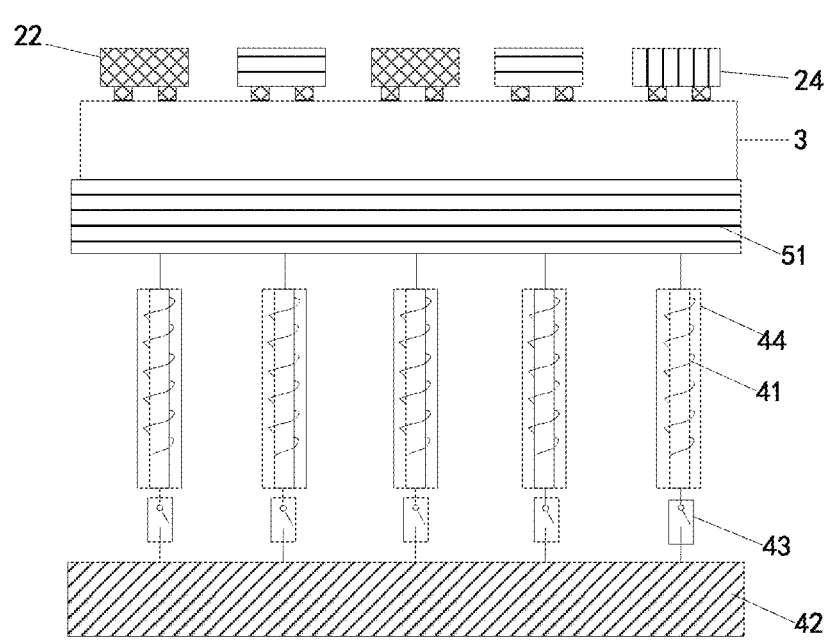
FIG. 17K is a schematic diagram of bonding the first light-emitting chip, the second light-emitting chip, and the third light-emitting chip to the circuit board provided in another embodiment of the present application.

S1708, referring to FIG. 17K, the solder or conductive glue on the pads 31 is heated and melted through the heating platform 51, so that each first light-emitting chip 22, each second light-emitting chip 23, and each third light-emitting chip 24 are bonded to the circuit board 3, and then the circuit board 3 is removed from the heating platform.

It can be seen that, in the above chip transfer process, combined with the advantages of laser transfer and magnetic transfer, mass transfer can be achieved without any chip weakening structure. Further, in the process of mass transfer, there is no need to transfer the light-emitting chip to any temporary substrate or transfer substrate, and the light-emitting chip can be detached from the growth substrate (also known as the native substrate) by directly using a laser (such as, but not limited to, a laser with a wavelength of 248 nm or 266 nm) and accurately transferred to the corresponding chip bonding area on the circuit board, which is fast and has high yield. In addition, directly detaching the light-emitting chip on the growth substrate with the laser is recognized as the ultimate mass transfer technology. The above chip transfer method provided in this embodiment can avoid displacement or flipping of the light-emitting chip detached from the growth substrate in the process of falling to the circuit board, can realize rapid and selective mass transfer, and greatly reduce the production cost of the chip, and facilitate the mass production of micro LEDs or mini LEDs.

A display screen is also provided in this embodiment. The display screen can be a flexible display screen or a rigid display screen, and can be a regular-shaped display screen such as a rectangle display screen, a circle display screen, an ellipse display screen, etc., or a special-shaped display screen. The display screen includes a display screen frame and a display panel as shown in the above examples, where the display panel is made of the above light-emitting assembly and is fixed in the display screen frame. It should be understood that, the display screen in this embodiment can be applied to various electronic devices, such as monitors, computers, mobile phones, smart watches, in-vehicle devices, billboards, and the like. The display screen has higher production efficiency, lower cost, better yield, higher light-emitting efficiency, and better display effect.

It should be understood that, the present application is not limited to be applied to the above examples. For those of ordinary skill in the art, improvements or changes can be made according to the above descriptions, and all these improvements and changes should belong to the protection scope of the appended claims of the present application.

What is claimed is:

1. A light-emitting chip transfer system, comprising:
   a growth substrate aligning a light-emitting chip with a chip bonding area on a front surface of a circuit board, wherein the light-emitting chip is magnetic and is bonded to the growth substrate through a laser dissociation layer, and the light-emitting chip and the chip bonding area aligned with the light-emitting chip are separated by a gap;
   a laser device configured to irradiate a laser to the laser dissociation layer, wherein the laser dissociation layer is dissociated under laser irradiation, to separate the light-emitting chip from the growth substrate; and
   a magnetic field generating device disposed at one side away from the front surface of the circuit board and configured to generate a magnetic field in the gap, wherein the magnetic field is configured to attract the light-emitting chip separated from the growth substrate to fall onto the chip bonding area aligned with the light-emitting chip.

2. The light-emitting chip transfer system of claim 1, wherein the laser dissociation layer is a gallium nitride layer, and the gallium nitride layer is dissociated into metal gallium and nitrogen gas under laser irradiation.

3. The light-emitting chip transfer system of claim 1, wherein
   the chip bonding area on the front surface of the circuit board is embodied as a plurality of chip bonding areas;
   the magnetic field generating device comprises a plurality of induction coils in one-to-one correspondence with the plurality of chip bonding areas, and a power supply device configured to supply power to the plurality of induction coils; and
   for each induction coil, a magnetic field is generated in a gap between the light-emitting chip and the chip bonding area corresponding to the induction coil when the induction coil is powered on.

4. The light-emitting chip transfer system of claim 3, wherein the magnetic field generating device further comprises switches, and each of the switches is arranged between each of the plurality of induction coils and the power supply device and configured to control conduction and disconnection between each of the plurality of induction coils and the power supply device.

5. The light-emitting chip transfer system of claim 3, wherein the magnetic field generating device further comprises diamagnetic covers covering the plurality of induction coils respectively.

6. The light-emitting chip transfer system of claim 3, wherein the plurality of induction coils are disposed in the circuit board.

7. The light-emitting chip transfer system of claim 6, further comprising a plurality of heat generating units respectively disposed between the plurality of induction coils and the plurality of chip bonding areas, wherein each heat generating unit is configured to generate heat after being powered on, to heat a solder or conductive glue on pads in each chip bonding area to melt the solder or conductive glue, to bond electrodes of the light-emitting chip falling onto the chip bonding area with the pads.

8. The light-emitting chip transfer system of claim 3, wherein the plurality of induction coils are disposed outside the circuit board.

9. The light-emitting chip transfer system of claim 3, further comprising a heating platform configured to carry the circuit board, wherein the heating platform is configured to heat a solder or conductive glue on pads in each chip bonding area to melt the solder or conductive glue, to bond electrodes of the light-emitting chip falling onto the chip bonding area with the pads.

10. The light-emitting chip transfer system of claim 1, further comprising a pressing sheet, wherein the pressing sheet is configured to press the light-emitting chip falling onto the chip bonding area aligned with the light-emitting chip to the chip bonding area.

11. The light-emitting chip transfer system of claim 1, wherein the chip bonding area on the front surface of the circuit board is embodied as a plurality of chip bonding areas, and the magnetic field generating device comprises one electromagnetic coil corresponding to the plurality of chip bonding areas, and a magnetic field is generated in a gap between each of the plurality of chip bonding areas and the light-emitting chip when the electromagnetic coil is powered on.

12. The light-emitting chip transfer system of claim 1, wherein the chip bonding area on the front surface of the circuit board is embodied as a plurality of chip bonding areas, and the magnetic field generating device comprises a plurality of permanent magnet units in one-to-one correspondence with the plurality of chip bonding areas.

13. The light-emitting chip transfer system of claim 1, wherein the chip bonding area on the front surface of the circuit board is embodied as a plurality of chip bonding areas, and the magnetic field generating device comprises one permanent magnet corresponding to the plurality of chip bonding areas.

14. A light-emitting chip transfer method, applicable to a light-emitting chip transfer system comprising a growth substrate aligning a light-emitting chip with a chip bonding area on a front surface of a circuit board, wherein the light-emitting chip is magnetic and is bonded to the growth substrate through a laser dissociation layer, and the light-emitting chip and the chip bonding area aligned with the light-emitting chip are separated by a gap, a laser device configured to irradiate a laser to the laser dissociation layer, wherein the laser dissociation layer is dissociated under laser irradiation, to separate the light-emitting chip from the growth substrate, and a magnetic field generating device disposed at one side away from the front surface of the circuit board and configured to generate a magnetic field in the gap, wherein the magnetic field is configured to attract the light-emitting chip separated from the growth substrate to fall onto the chip bonding area aligned with the light-emitting chip, the method comprising:
  aligning the light-emitting chip on the growth substrate with the chip bonding area on the circuit board; and
  irradiating the laser dissociation layer with the laser, such that the light-emitting chip to be transferred is separated from the growth substrate, and falls onto the chip bonding area aligned with the light-emitting chip under the attraction of the magnetic field.

15. The light-emitting chip transfer method of claim 14, further comprising:
  heating the solder or conductive glue on the pads in the chip bonding area to melt the solder or conductive glue, so as to bond the electrodes of the light-emitting chip falling in the chip bonding area to the pads.

16. The light-emitting chip transfer method of claim 15, wherein before heating the solder or conductive glue on the pads in the chip bonding area to melt the solder or conductive glue, the method further comprises:
  pressing the light-emitting chip falling onto each of the plurality of chip bonding areas against each of the plurality of chip bonding areas through the pressing sheet.

17. The light-emitting chip transfer method of claim 14, wherein the growth substrate comprises a first growth substrate grown with a first light-emitting chip, a second growth substrate grown with a second light-emitting chip, and a third growth substrate grown with a third light-emitting chip, and a light-emitting color of the first light-emitting chip, a light-emitting color of the second light-emitting chip, and a light-emitting color of the third light-emitting chip are different, wherein
  aligning the light-emitting chip on the growth substrate with the chip bonding area on the circuit board comprises:
    aligning the light-emitting chip on one of the first growth substrate, the second growth substrate, and the third growth substrate with the chip bonding area on the circuit board; and
    aligning the light-emitting chip on a current growth substrate with the chip bonding area on the circuit board after the light-emitting chip on the previous growth substrate falls to the chip bonding area aligned with the light-emitting chip, wherein
    a height of the gap between the light-emitting chip on the current growth substrate and the chip bonding area on the circuit board is greater than or equal to a height of the light-emitting chip that has fallen onto the chip bonding area.

18. The method of claim 14, wherein before irradiating the laser dissociation layer with the laser, the method further comprises:
  detecting each light-emitting chip on the growth substrate; and
  removing an unqualified light-emitting chip from the growth substrate or marking the unqualified light-emitting chip.

19. The method of claim 18, wherein detecting each light-emitting chip on the growth substrate comprises at least one of:
  detecting appearance of each light-emitting chip; or
  testing an optical property of each light-emitting chip.

20. The method of claim 14, wherein irradiating the laser dissociation layer with the laser comprises:

irradiating a part of the laser dissociation layer with the laser, wherein the part of the laser dissociation layer is an area of the laser dissociation layer between the light-emitting chip to be transferred and the growth substrate; or irradiating the whole laser dissociation layer with the laser.

* * * * *